United States Patent
Kashai et al.

(10) Patent No.: US 6,907,599 B1
(45) Date of Patent: Jun. 14, 2005

(54) SYNTHESIS OF VERIFICATION LANGUAGES

(75) Inventors: Yaron Kashai, Sunnyvale, CA (US); Matthew John Morley, San Francisco, CA (US)

(73) Assignee: Verisity Ltd., Rosh HaAyin (IL)

(*) Notice: Subject to any disclaimer, the term of this patent is extended or adjusted under 35 U.S.C. 154(b) by 404 days.

(21) Appl. No.: 09/880,888

(22) Filed: Jun. 15, 2001

(51) Int. Cl.[7] .............................................. G06F 9/45
(52) U.S. Cl. ..................... 717/137; 717/143; 717/144; 716/10; 716/18
(58) Field of Search ................................ 717/135–157, 717/106–113, 141–144; 703/1–4, 13–15, 22, 26–28; 704/220; 716/2–5, 17–18, 10

(56) References Cited

U.S. PATENT DOCUMENTS

| | | | |
|---|---|---|---|
| 5,383,167 A | | 1/1995 | Weil |
| 5,404,319 A | * | 4/1995 | Smith et al. ................... 716/18 |
| 5,493,508 A | * | 2/1996 | Dangelo et al. ................ 716/5 |
| 5,818,263 A | | 10/1998 | Ashuri |
| 5,901,061 A | | 5/1999 | Gaddis et al. |
| 6,009,256 A | | 12/1999 | Tseng et al. |
| 6,182,258 B1 | | 1/2001 | Hollander |
| 6,625,797 B1 | * | 9/2003 | Edwards et al. ............... 716/18 |

FOREIGN PATENT DOCUMENTS

EP    0 834 823 A1 *  4/1988  ........... G06F/17/50

OTHER PUBLICATIONS

Amellal et al, "Scheduling of a Control Data Flow Graph", IEEE, pp.: 1666–1669, May 1993.*

* cited by examiner

Primary Examiner—Ted T. Vo
(74) Attorney, Agent, or Firm—G.E. Ehrlich (1995) Ltd.

(57) ABSTRACT

A method for synthesizing a verification language, and thereby enabling the verification language to be compiled into a target language. This method enables the underlying control structure of the verification language to be determined, and then used to map the dynamic behavior of the verification language onto the target language as part of a static framework. The process of synthesizing any type of verification language causes at least a portion of the implicit control structure of the software program to be constructed into the compiled output code, such that an additional scheduler or other type of runtime system may not be required. Therefore, the compiled output code should have a greater execution speed and should be operated more efficiently than the software programs which are written in the verification language itself.

22 Claims, 15 Drawing Sheets

L ← refto( top unit )
C = Φ
while L !=Φ
    for each reference r in L begin
        NL ← Φ
        t ← typeof( r )
        r.target ← makenode( t )
        C ← C+{ constraints of t }
        for each field f in t begin
            NL ← NL + refto( f )
            C ← apply( C )
        end
    end
    L ← L + NL
end

Fig. 2

```
<' struct cl {                       // arbiter client
    id          :int;             // my id
    data        :int;             // data   - INPUT
    !drdy       :bool;            // data ready - INPUT
    !xreq       :bool;            // transfer request - interface to arb
    !xgrt       :bool;            // transfer grant - arb sets this
    arb         :arb;
    keep arb == sys.arb;
};

struct arb {
    cls         :list of cl;
    data        :int ;            // data destination
};

extend sys {
    cl_list     :list of cl;
    keep cl_list.size () == 4;
    keep for each in cl_list {
        .id == index;
    };
    arb         :arb;
    keep arb.cls == cl_list;
};

```
1   <'
2   struct cl {                              // arbiter client
3       id              :int;                // my id
4       data            :int;                // data - INPUT
5       !drdy           :bool;               // data ready - INPUT
6       !xreq           :bool;               // transfer request
7       !xgrt           :bool;               // transfer grant
8       arb             :arb;
9       keep arb == sys.arb;
10
11      trans() @sys.clk is {
12          while TRUE {
13              wait true(drdy);
14              xreq = TRUE;
15              wait true(xgrt);
16              arb.data = data;
17              wait cycle;
18              xreq = FALSE;
19              wait true(not xgrt);
20              drdy = FALSE;
21          };
22      };
23  };
24
25  struct arb {
26      cls             :list of cl;
27      data            :int;                // data destination
28      switch() @sys.clk is {
29          while TRUE {
30              for each in cls {
31                  if .xreq then {
32                      .xgrt = TRUE;
33                      wait true(not .xreq);
34                      .xgrt = FALSE;
35                  };
36              };
37              wait cycle;
38          };
39      };
40  };
41
42  extend sys {
43      cl_list         :list of cl;
44      keep cl_list.size() == 4;
45      keep for each in cl_list {
46          .id == index;
47      };
48      arb             :arb;
49      keep arb.cls == cl_list;
50      event clk;
51  };
52  '>
```

```
for each node n in EG such that n has processes begin
   for each process p in n begin
      for each segment s in p begin
         for each action a in s begin
            for each read expression e in a begin
               t ← evaluate( e, context )
               tag t with {n, s, 'read'}
            end
            for each write expression e in a begin
               t ← evaluate( e, context )
               tag t with {n, s, 'write'}
            end
         end
      end
   end
end
```

```
1   Peterson's mutex algorithm - simple two agent example
2
3   <'
4
5   struct agent {
6       req     :bool;
7       id      :int;
8       oa      :agent;
9       p() @sys.clk is {
10          req = TRUE;
11          sys.k = id;
12          while (sys.k == id) && oa.req {
13              wait cycle;
14          };
15          wait cycle;        // Critical segment
16          sys.w = id;
17          req = FALSE;
18      };
19  };
20
21  extend sys {
22      k   :int;       // Requestors id.
23      w   :int;       // The protected data field
24      a0  :agent;
25      a1  :agent;
26      keep a0.id == 0;
27      keep a0.oa == a1;
28      keep a1.id == 1;
29      keep a1.oa == a0;
30      event clk;
31  };
32
33  '>
```

Fig. 11

```
1
 2      This is an iterator access to hierarchical arrays
 3
 4      <'
 5      struct ball {
 6           dat       :uint (bits:3);
 7           mat       :list of bool;
 8           keep mat.size() == 2;
 9      };
10
11      struct box {
12           flag      :bool;
13           bl        :list of ball;
14           keep bl.size() == 5;
15      };
16
17      struct iter_type {
18           ar        :list of box;
19           foo() @sys.clk is {
20                wait cycle;
21                for each in ar {
22                     .flag = TRUE;
23                     for each in .bl {
24                          .dat = 2;
25                          .mat[1] = FALSE;
26                     };
27                };
28                ar[2].bl[3].mat[0] = TRUE;
29                ar[2].bl[sys.ind].mat[0] = TRUE;
30           };
31      };
32
33      extend sys {
34           event clk;
35           arr       :list of box;
36           keep arr.size() == 4;
37           ind       :int;
38
39           iter      :iter_type;
40           keep iter.ar == arr;
41      };
42
43      '>
```

Fig. 15 ns# SYNTHESIS OF VERIFICATION LANGUAGES

FIELD OF THE INVENTION

The present invention relates to the synthesis of verification specific languages, and in particular, to a method for compiling a program written in such a language into a target language, of which a preferred example is a HDL (hardware description language).

BACKGROUND OF THE INVENTION

Design verification is the process of determining whether an integrated circuit, board, or system-level architecture, exactly implements the requirements defined by the specification of the architecture for that device. Design verification for a device under. testing (DUT) may be performed on the actual device, or on a simulation model of the device. For the purposes of explanation only and without intending to be limiting in any way, the following discussion centers upon testing which is performed on simulation models of the device.

As designs for different types of devices and device architectures become more complex, the likelihood of design errors increases. However, design verification also becomes more difficult and time consuming, as the simulation models of the design of the device also become more complex to prepare and to test.

The problem of design verification is compounded by the lack of widely generalizable tools which are useful for the verification and testing of a wide variety of devices and device architectures. Typical background art verification methods have often been restricted to a particular device having a specific design, such that the steps of preparing and implementing such verification methods for the simulation model must be performed for each new device.

The process of verifying a design through a simulation model of the device is aided by the availability of hardware description languages, or HDL, such as Verilog and VHDL. These languages are designed to describe hardware at higher levels of abstraction than gates or transistors. The resultant simulated model of the device can receive input stimuli in the form of test vectors, which are a string of binary digits applied to the input of a circuit. The simulated model then produces results, which are checked against the expected results for the particular design of the device. However, these languages are typically not designed for actual verification. Therefore, the verification engineer must write additional programming code in order to interface with the models described by these hardware description languages in order to perform design verification of the device. In particular, the e verification specific language is highly useful for design verification.

One example of a useful verification language is the e language which is provided by the Specman™ functional programming environment (Verisity Design, Inc., Mountain View, Calif., USA) and disclosed in U.S. Pat. No. 6,182,258, filed on Feb. 6, 1998, which is hereby incorporated by reference as if fully set forth herein. Although the e language is highly useful for creating programs for design verification, it still has certain drawbacks. For example, like most software languages, e code does not have a clear static structure, and the dynamic functionality of the model is open to interpretation at runtime, most notably with regard to timing. By contrast, hardware description languages have a more clear static structure and are less ambiguous with regard to issues such as timing. However, this latter type of language does not inherently provide the dynamic aspects of verification languages such as the e language.

SUMMARY OF THE INVENTION

None of the background art references teaches or suggests a method for automatically translating the e language into a hardware description language.

The present invention overcomes these drawbacks of the background art by providing a method for synthesizing the e language, and thereby enabling the language to be compiled into a target language. This method enables the underlying control structure of the language to be determined, and then used to map the dynamic behavior of the language onto the target language as part of a static framework. The process of synthesizing any type of language causes at least a portion of the implicit control structure of the software program to be constructed into the compiled output code, such that an additional scheduler or other type of runtime system may not be required. Therefore, the compiled output code should have a greater execution speed and should be operated more efficiently than the software programs which are written in the source language itself.

According to the present invention, there is provided a method for automatically translating code written in a first language to a second target language, the first language featuring dynamic behavior, wherein the second target language features a hierarchy of objects, such that relationships between the objects are determined by constraints in the first language, the method comprising: detecting an underlying control structure for the code in the first language; creating a static framework of resources for supporting the dynamic behavior of the code written in the first language; and mapping the dynamic behavior to the second target language according to the static framework of resources and according to the underlying control structure.

The method of the present invention could also be described as a plurality of instructions being performed by a data processor, such that the method of the present invention could be implemented as hardware, software, firmware or a combination thereof. For the present invention, a software application could be written in substantially any suitable programming language, which could easily be selected by one of ordinary skill in the art. The programming language chosen should be compatible with the computing platform according to which the software application is executed. Examples of suitable programming languages include, but are not limited to, C, C++ and Java.

BRIEF DESCRIPTION OF THE DRAWINGS

The invention is herein described, byway of example only, with reference to the accompanying drawings, wherein:

FIG. 2 shows an example of "pseudocode" for performing a breadth-first elaboration according to the present invention;

FIG. 3 shows an example of the elaboration process with regard to implementation with the e language according to the present invention;

FIG. 6 shows an example of e language code input for creating a sequential control flow graph according to the present invention;

FIG. 11 shows a simple two process example as written in the e language;

FIG. 15 shows an iterator access to hierarchical arrays; and

DESCRIPTION OF THE PREFERRED EMBODIMENTS

The present invention provides a method for synthesizing a verification language, and thereby enabling the verification language to be compiled into a target language, such as a hardware description language (HDL) for example. The preferred example of such a verification language, and the language which is used for describing the preferred embodiments of the present invention, is the e language. Of course, the present invention could also be used with other types of verification languages, as well as with a variety of target languages.

The process of synthesizing any type of verification language causes at least a portion of the implicit control structure of the software program to be constructed into the compiled output code, such that an additional scheduler or other type of runtime system may not be required. Therefore, the compiled output code should have a greater execution speed and should be operated more efficiently than the software programs which are written in the verification language itself. However, the process of synthesis may be expected to have two problems. First, a static framework must be created which is sufficient to support the dynamic behavior of the temporal code. Second, the dynamic behavior must be mapped onto the target language, such that the execution of the compiled code accurately represents the dynamic behavior of the verification language itself.

Although the e temporal language was not designed for synthesis, it does have a general structure which can be related to the behavior of hardware devices, to a much greater extent than "pure" software languages such as Java and C++. Therefore, the e language is the preferred verification language for the present invention, although as previously noted, it is not the only such verification language which is useful for the synthesis process.

Figure 1:
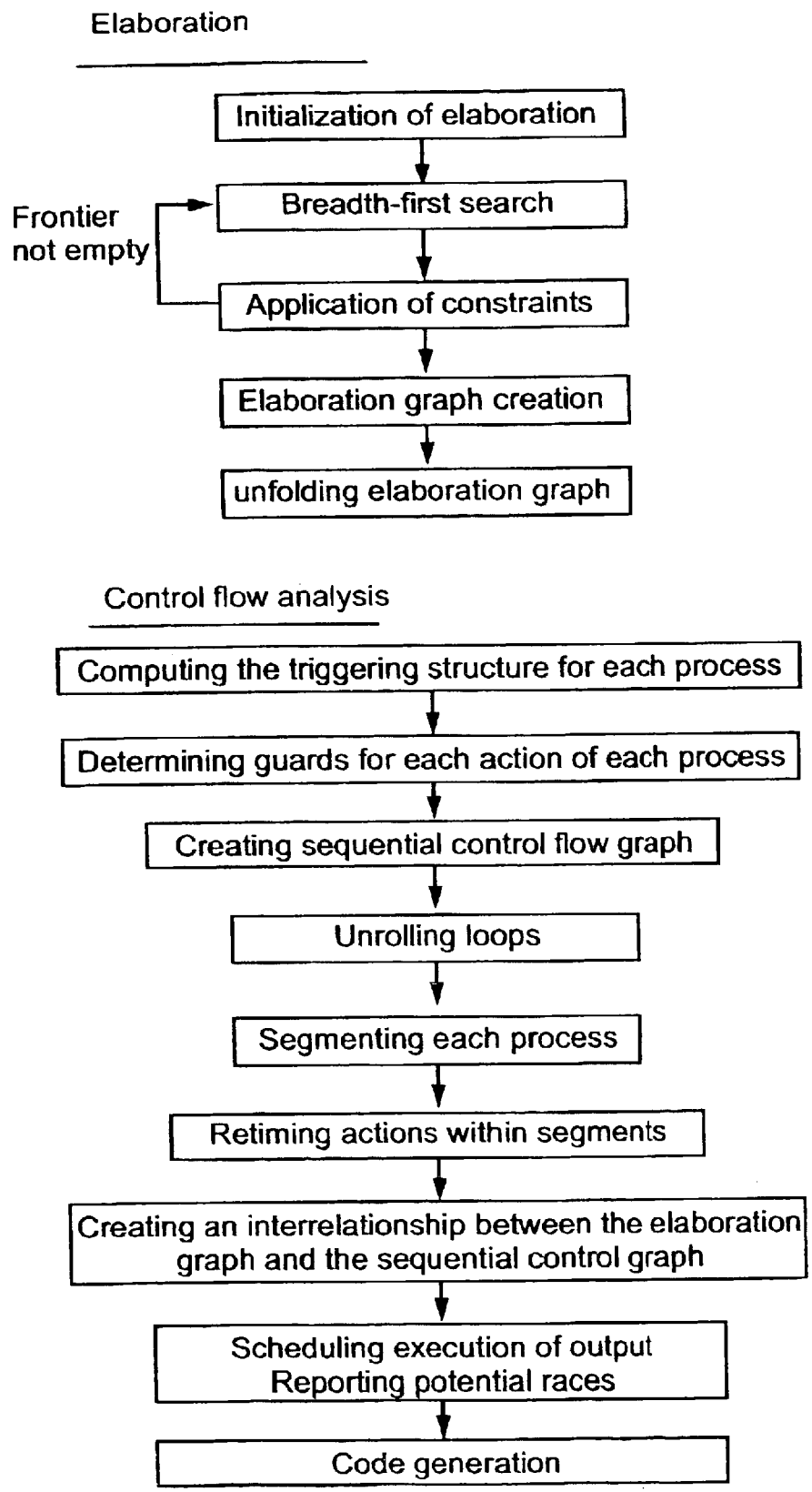
FIG. 1 is a flowchart of an illustrative method according to the present invention.

Referring now to the drawings, FIG. 1 is a flowchart of an exemplary method for synthesis according to the present invention. As shown, the method first involves "elaborating" the verification language, in a process which is termed herein "elaboration". The process of elaboration involves the allocation of sufficient state holding elements to represent all possible behavior which may be invoked by the e language program. In particular, structures which are present prior to execution are considered to be static, while objects allocated "on the fly" during execution are considered to be transient. The latter objects may be handled at run time by data transfer, as all required structures should be represented in the compiled language prior to execution.

In order to represent these structures, preferably the static structure of the verification language is expanded according to predefined semantic constructions, thereby resulting in compiled code of a predictable construction. Although alternatively the dynamic properties of the verification language could be captured by executing the verification language, such that the dynamic aspects of the language are literally operated, such an alternative approach has a number of disadvantages. For example, higher level information regarding the roles of scalars and objects is lost in the alternative approach, such that further analysis of the dynamic structure is not possible. Thus, for the preferred embodiment of the present invention, the static structure is determined according to predefined semantic constructions.

These predefined semantic constructions optionally and more preferably include nesting of types and the determination of structural constraints. The process of construction according to nesting of types means that elaboration always starts from a top unit, and then recursively includes descendants of that unit. Structural constraints are embedded within the type declarations, and are used to impose relationships between parts of the structure, as well as for imposing initial values and constant values on fields. Timing-dependent, or when inheritance constructions further complicate this process, since these constructions may require the determination of an entire subtree of possibilities if the exact construction cannot otherwise be determined.

As shown with regard to FIG. 1, the method of the present invention preferably starts with parsing the input program written in the source language and creating an abstract syntax tree, as known in the art. The process continues with the creation of an elaboration graph, which is the start of the elaboration process. For the preferred graph embodiment, each instance of an object or a scalar is represented by a node. All graph nodes contain their type information. Preferably, there are three major types of nodes: scalar nodes, which may contain initial or constant values; struct nodes which reference nested instances; and list nodes, which reference list items, list size and index roles. All nodes have a parent reference which is decided according to the creation order (as described in greater detail below). Directed edges mark references. Edges are tagged with the name which is used to access the target when positioned at the source.

The elaboration process is preferably performed with a breadth-first traversal, as shown with regard to FIG. 1. An example of "pseudocode" for performing such a breadth-first traversal is shown with regard to FIG. 2. The breadth-first traversal involves the collection of structural constraints, and the application of such constraints at each level of the traversal process. Constraints preferably assign values and unify instances. For the latter activity, more preferably only the instance closer to the root is retained, in order to avoid infinite recursion.

If a constraint cannot be applied at that level, for example because the constraint contains an argument which has not yet been invoked, then preferably it is collected into an "unsatisfied constraint list". Also preferably, the breadth-first search includes the process of repeatedly examining this list, in an attempt to apply one or more of the constraints at each level of the search.

Next, a unique parent is identified for each instance, which is the first or topmost entity that referenced the instance. It should be noted that if multiple references are made from the same level of the search, the parent relationship may optionally be considered to be arbitrary.

According to preferred embodiments of the present invention, special consideration is given to maintaining any type of symmetry which is inherent in the verification language, at least to the extent possible while also synthesizing the program code. The preferred implementation of the present invention with the e language is therefore helpful for the maintenance of symmetry, since certain features of the e language are helpful for detecting and maintaining symmetry. For example, lists are widely used in the e language, often in a manner which preserves symmetry. Lists themselves are inherently symmetric types, in which a representative item can stand for all items, thus simplifying the analysis. The method of the present invention further maintains such symmetry by more preferably providing list nodes which have dual representation, with a symmetric list item representative which stands for all items, and a list of all outstanding items which are distinguished from the symmetric list item. According to the present invention, more preferably all lists are initially assumed to be symmetric, with the process of synthesis switching from the symmetric representation to the explicit representation under certain conditions which break symmetry, as described in greater detail below.

Another example of maintaining symmetry is implemented with regard to scalars. For example, a scalar which is used as an index into a symmetric array. Such a scalar does not break symmetry while being used as an index, as long as the scalar is not assigned a particular value.

These processes are preferably repeated in order to create the graph, thereby forming the elaboration process. Exemplary pseudocode for such a process is shown with regard to FIG. 2. As shown, L is the set of nodes in the current search level, while C is the unsatisfied constraint set. The function apply( ) takes the set of unsatisfied constraints, attempts to modify the structure to match the constraints and returns the set of constraints which remained unsatisfied. The function typeof( ) receives an instance reference and returns a type descriptor, while the function refto( ) receives a type descriptor and returns a graph reference edge. The function makenode( ) receives a reference and returns the graph node corresponding to the instance.

As shown in FIG. 2, the exemplary pseudocode algorithm starts with a reference to the top unit. For each reference r in the set of nodes L, a type description is first determined. Next, the node corresponding to the reference is returned by the function makenode( ). Constraints for that type description are added to the list of unsolved constraints C. Each field in the type description is then examined with regard to the list of unsolved constraints, in order to determine whether any of the constraints may be applied. In addition, a new reference edge is also returned, for connecting the new graph node to the remainder of the graph. This process is then preferably repeated, more preferably until all of the constraints have either been applied or are considered to be unsolvable.

Figure 4:
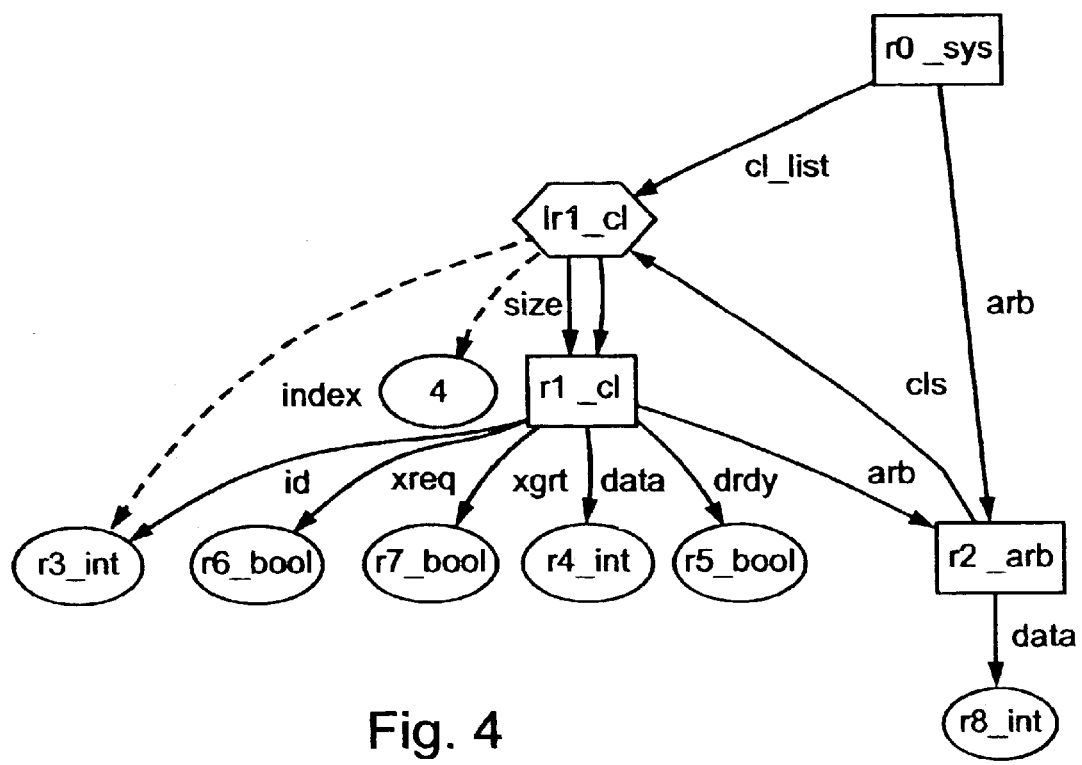
FIG. 4 shows an exemplary graph according to the present invention which results from the execution of the code of FIG. 2.

FIG. 3 shows an example of the elaboration process with regard to implementation with the e language. This exemplary process includes nested structs and lists of structs, although methods have been omitted for brevity. An exemplary graph according to the present invention which results from the execution of this code is shown in FIG. 4. Boxes represent e structs, ellipses represent scalars and octagons represent lists. Dashed links represent special roles, such as indices.

The exemplary program contains a top level object called sys, which contains a nested list of objects, called cl_list, the objects being of type cl. The constraints within sys determine cl_list to contain 4 elements, with each element's id field being set to the element's index in the list. Sys also contains an object called arb of type arb. The cls field of this object is constrained to reference the cl_list list mentioned above. The arb type is shown to contain a list of cl type called cls and an integer field called data. The type cl is shown to contain multiple scalar fields and an arb field of type arb. The arb field is constrained to be the same as the arb field under sys.

FIG. 4 shows the static structure that is extracted by the elaboration process. Using the constraints under sys and under cl, the process resulted in a single list of cl type elements and a single arb object in spite of what seems to be an infinitely recursive structure.

Turning again to FIG. 1, the process of elaboration is preferably completed when all of the constraints have either been applied or are considered to be unsolvable. However, optionally and more preferably, as shown, the completed graph is unfolded in order to more completely represent the verification language structures. For example, the completed graph is more preferably unfolded when the symmetrical properties of lists are broken. An example of a situation in which the symmetry of a list is broken occurs when the objects in a list have embedded Time Consuming Methods (which are independent threads of control or processes, termed "TCMs" herein) or temporal expressions. Since these processes have an internal state, and since these processes are likely to be at different states per instance, the list is no longer symmetric.

Figure 5A:
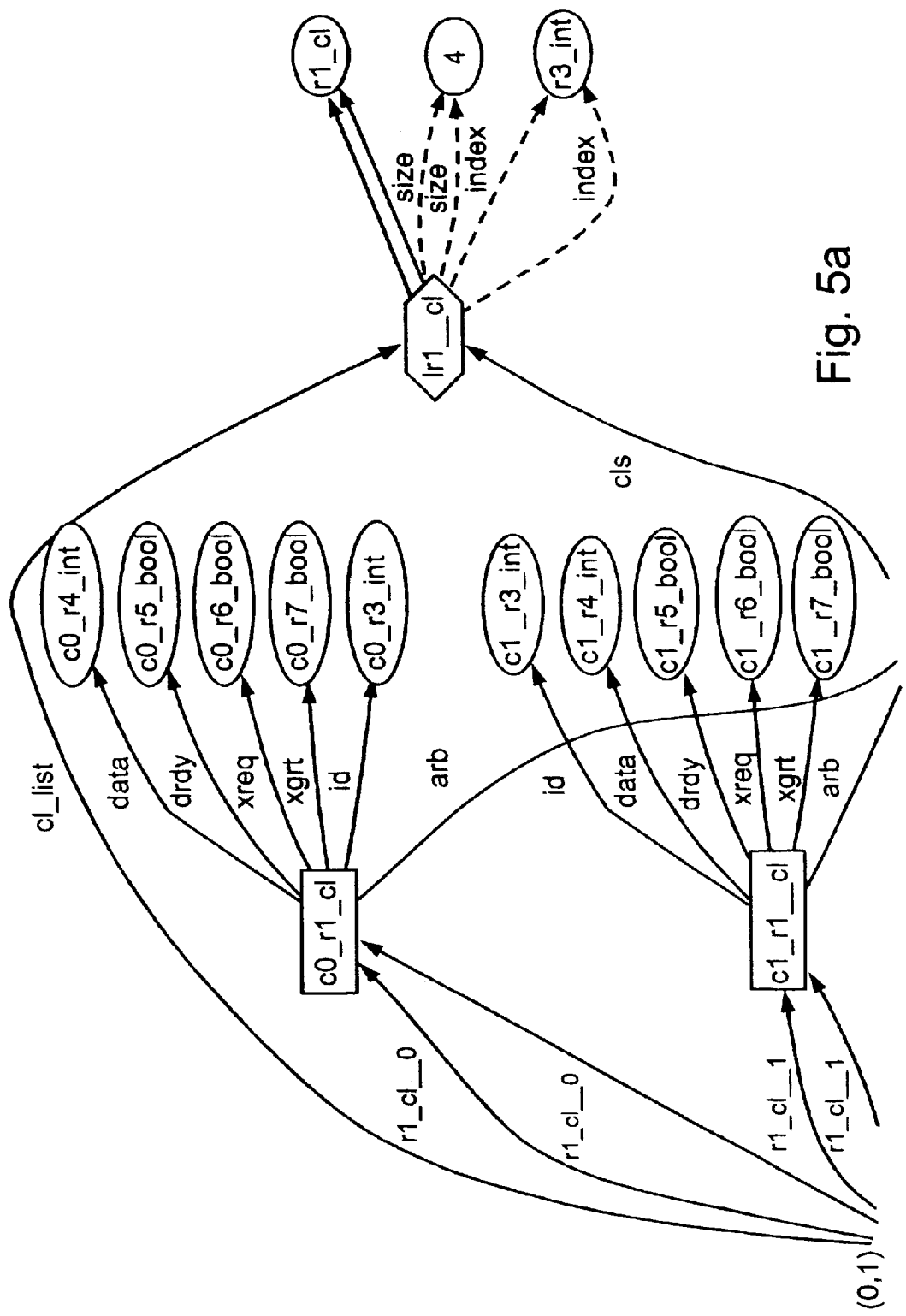
FIGS. 5A and 5B shows the exemplary graph of FIG. 4 after being unfolded.
Figure 5B:
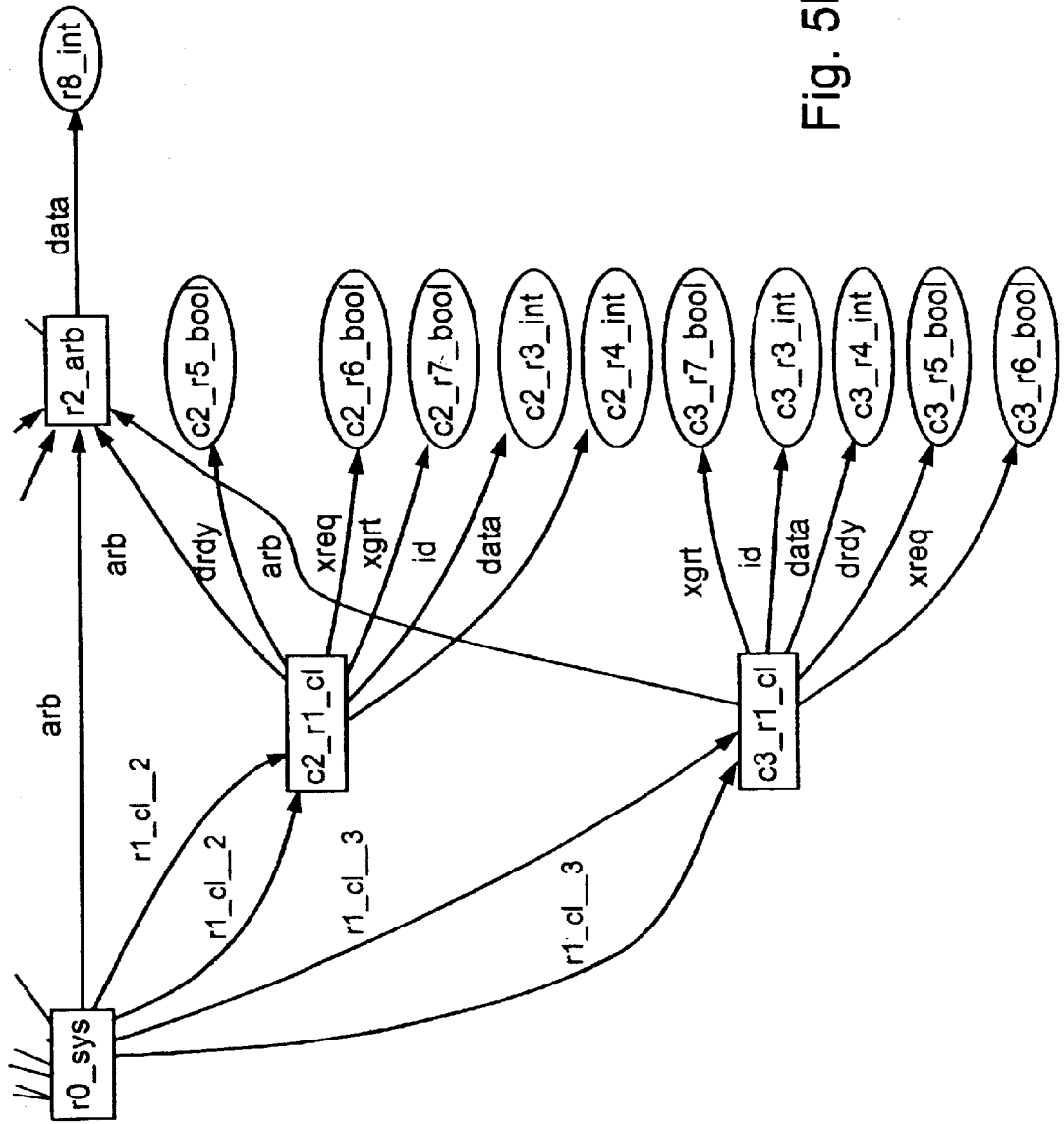

FIGS. 5A and 5B show the exemplary graph of FIG. 4 after being unfolded, which in this example is required since the cl struct has a TCM in it. The unfolded graph includes all possibilities for this struct, since the state of the struct cannot be predetermined during the elaboration process.

Turning again to FIG. 1, the exemplary method shows the analysis of the control structure, or control flow analysis. Although this analysis is shown as a separate and sequential stage which follows the elaboration stage, in fact the analysis of the control structure may optionally be performed in parallel with the process of elaboration. The analysis of the control structure is preferably performed with regard to the methods and temporal expressions which are part of the e type declarations. In addition, the various instantiations of TCMs and events are preferably included in the analysis.

The end result of control flow analysis is to determine for each data processing action which conditions and triggers may cause that action to execute. For the preferred implementation of the present invention for compilation into a hardware design language as the target language, the semantics may be assumed to be synchronous and cycle based, such that boolean conditions and temporal triggers may be considered to be similar. However, preferably temporal triggers have computational priority over boolean expressions, for the preferred implementation of the present invention to correctly replicate the semantics of the e language. The only synchronous trigger remains the system clock, and all non-clock, temporal triggers and boolean conditions are termed "guards" herein. Therefore, control flow analysis should enable a list of guards to be determined for governing the execution of each action, thereby resulting in the creation of a sequential control flow graph.

Turning again to FIG. 1, control flow analysis is preferably initiated by first computing the triggering structure for each process. This computation is optionally and preferably performed by capturing the flow of control from the struct level to the TCM, or the temporal expression. The flow of control is captured by scanning the run( ) method for any start actions, handling spawning inside of TCMs, handling on methods (which are procedures executed when particular temporal expressions succeed), and so forth.

Next, the guards are computed for each action of each process, by analyzing the action sequence for each method, in order to determine non-clock, temporal triggers and boolean conditions. Optionally and more preferably, method calls cause the control flow of the called method to be instantiated in place of the call itself Once the guards have been determined, preferably the sequential control flow graph is created. This graph groups actions into basic blocks. Basic blocks may optionally be nested within guards, while guards can optionally be nested as well as chained. Actions which occur over a period of time, or are otherwise time-consuming such as wait and sync, are preferably represented by a special wait node which breaks basic blocks (as previously described, these blocks may optionally be segmented by actions which block processes, such as wait).

The sequential control flow graph is more preferably created from at least three types of nodes: basic nodes, guard nodes and wait nodes. Basic nodes represent a list of actions, none of which is time-consuming or is a control flow action. Guard nodes represent a branch point, and have a boolean expression which is a guard, a positive branch which is taken if the expression evaluates to true and a negative branch which executes otherwise. A label on the guard can mark it as a loop or an if then else action. A wait node is similar to a basic node, except that it contains a single temporal expression or other time consuming action, such as communicating through a port (and no other actions).

According to preferred embodiments of the present invention, the nodes of this graph retain references to the abstract syntax tree nodes, so that code generation can extract additional information. The entire graph is associated with the particular type of node of the abstract syntax tree.

An example of e language code input for creating the sequential control flow graph is shown in FIG. 6.

The code example contains a list of clients of type cl nested under the top object called sys. An arbiter object of type arb is nested under sys as well. The clients attempt to transfer data to a shared data field nested within the arbiter. While the clients operate concurrently, the access to the common field must be performed sequentially to prevent data corruption. Sequential access is preferably achieved by a protocol that executes between the arbiter and each client. When the client's data is ready for transmission, signaled by drdy being set by an external agent (not included in the sample code), the client asserts xreq. It then waits for the arbiter to notice the request and acknowledge by setting xgrt. At this point the data is transferred and the client deasserts request, which will cause the arbiter to deassert xgrt. Once the transfer is completed, the client deasserts drdy, to signal the termination for the external agent.

Figure 7:
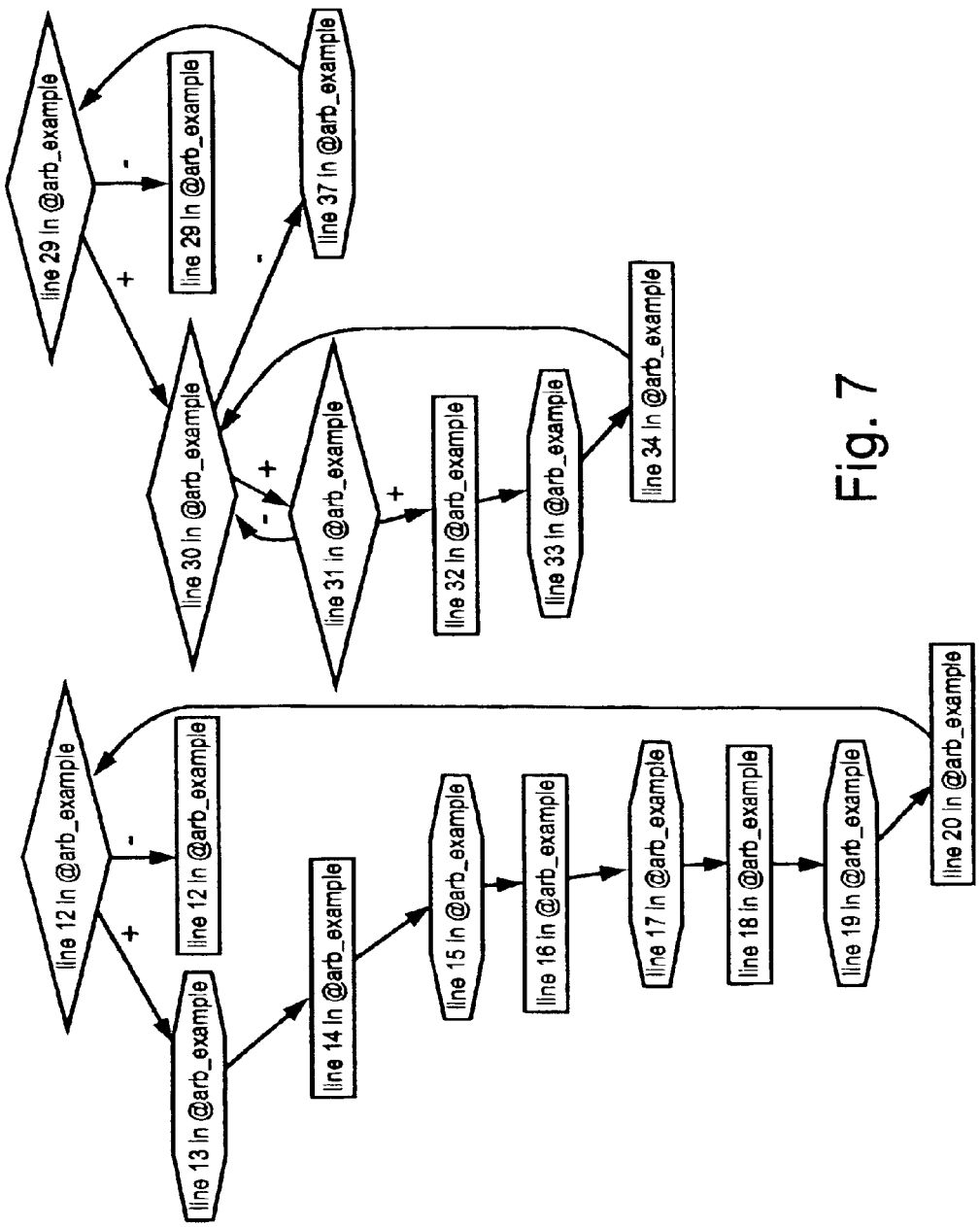
FIG. 7 shows the resultant sequential control flow graph from FIG. 6 according to the present invention.

The resultant sequential control flow graph is shown in FIG. 7. Boxes represent basic blocks, diamonds represent guards and octagons represent time consuming actions.

As the sequential control flow graph is created, context is more preferably established for at least one action. Certain actions, such as iterators and method calls, create local context. This local context is needed in order to interpret expressions and to locate references on the elaboration graph. The context for each action is preferably established by passing a list of name-reference pairs to the control flow extraction process. Additions are preferably made to the list each time that an action creates local variables. The list is then "popped", or non-relevant variables removed, each time that the process moves out of the scope of these variables. Optionally and more preferably, the context is saved on each wait node. Since execution may only commence at these nodes, the context information is more efficiently retrieved from these nodes.

According to optional but preferred embodiments of the present invention, the control flow extraction process may uncover at least one malformed control structure, which the user then preferably alters manually. One example of such a malformed control structure is a cycle which contains only conditional wait actions. Since there is an infinite number of ways to unwind the cycle, such code cannot be represented as a finite list of segments, which is a fundamental requirement of the code generation phase. Thus, the user is informed of the existence of such structures, and is preferably required to modify the code such that the loop is either wait free, or contains at least one unconditional wait.

Loops are then preferably unrolled, where needed. Some loops may need to be unrolled either because the loop structure is malformed as previously described, or due to unfolding of structures to which the loop refers. In cases of malformed control structures, the user preferably manually alters the code before the loop is unrolled. With regard to the unfolding of control structures to which the loop refers, one example of a situation in which such unfolding occurs is for unfolding of lists due to breaking of symmetry. Certain processes may use iterators to access the list; however, once the list is unfolded, iterative access is typically no longer supported, since the list structure has been altered. Therefore, the iterator itself must be unfolded in order for the list to be properly accessed.

The process of unrolling requires some support in terms of context value assignment. For example, a for each action adds variables such as it and index to the context. When unrolled, these variables become constants whose scope is a single iteration. This process is supported by a fourth sequential control flow graph node, which is called a context node. The context node adds a scope with either variables or constants to the context. A context node is added at the top of each iteration of the unrolled structure.

Figures 8, 8A:
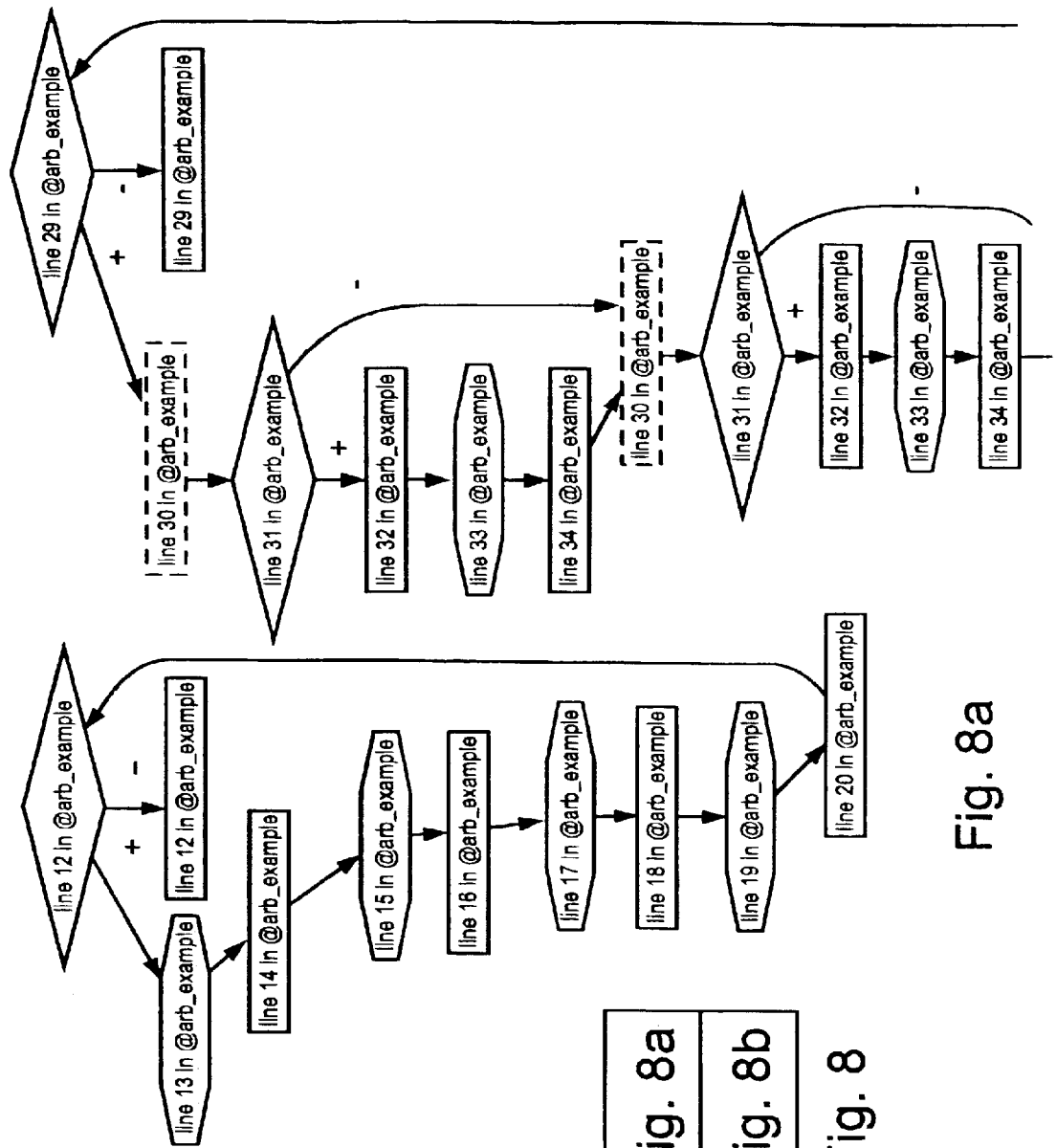
FIG. 8A and FIG. 8B show an exemplary unrolled graph after the process of unrolling is performed on the sequential control flow graph of FIG. 7 according to the present invention.
Figure 8B:
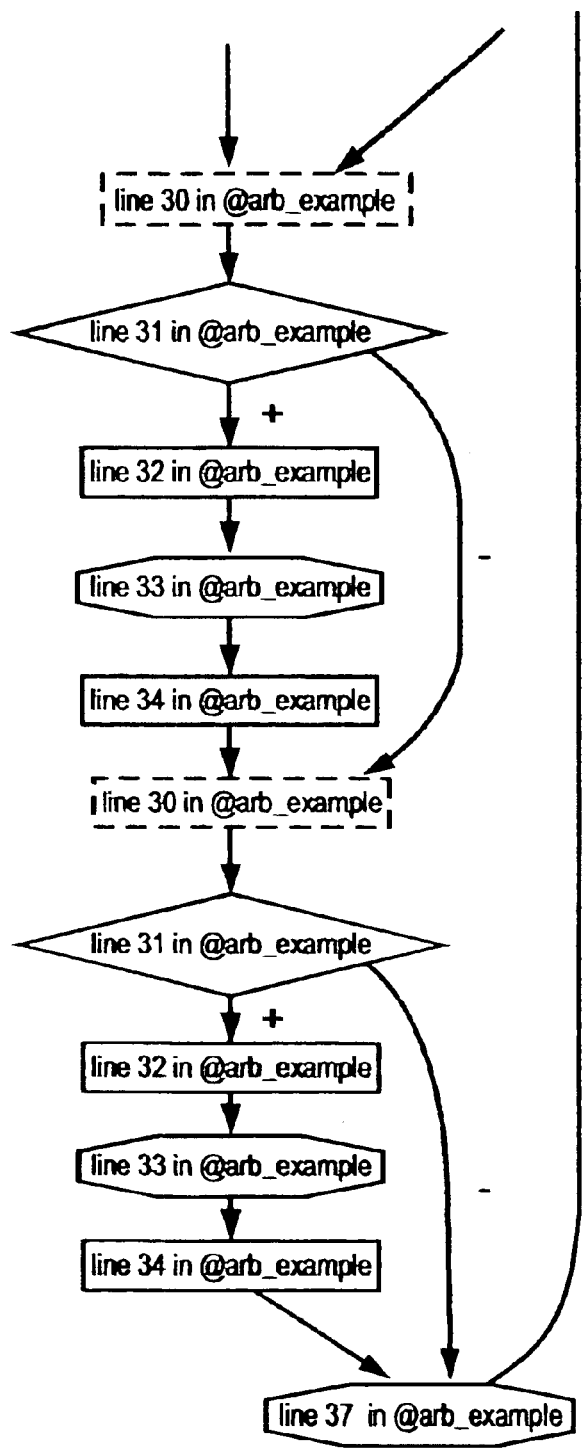

An example of an unrolled loop is described with regard to the example of FIG. 6. In that example, the TCM nested in the client objects cl causes the list to be unfolded. Since the arbiter process switch( ) accesses the list objects, the list iterator must be unrolled. The process of unrolling is performed on the sequential control flow graph, with the resultant new graph for the unrolled arbiter process being shown in FIG. 8. The dashed boxes in FIG. 8 represent context nodes.

Next, the segmentation of each process is more preferably computed, such that each segment represents an atomic execution. Such segmentation is highly preferred since some processes may block on some actions, such as the wait action. Therefore the processes need to be grouped into atomic sequences of execution, which are characterized by being cycle free (or at least containing zero time cycles only, depending upon the particular target language for implementation) and also by being free of any time consuming action, except at the very end of the sequence.

The segmentation process takes the sequential control flow graph, which is preferably (but not necessarily) a cyclic directed graph, and extracts all possible paths from the graph which start and finish with a wait node. Preferably, the entry and exit points to the whole graph are considered to be wait nodes too, as a simplification. Paths may fork and join, but may still be considered to lie within the same segment, as long as they are not interrupted by a time-consuming action such as a wait node.

Figures 9, 10:
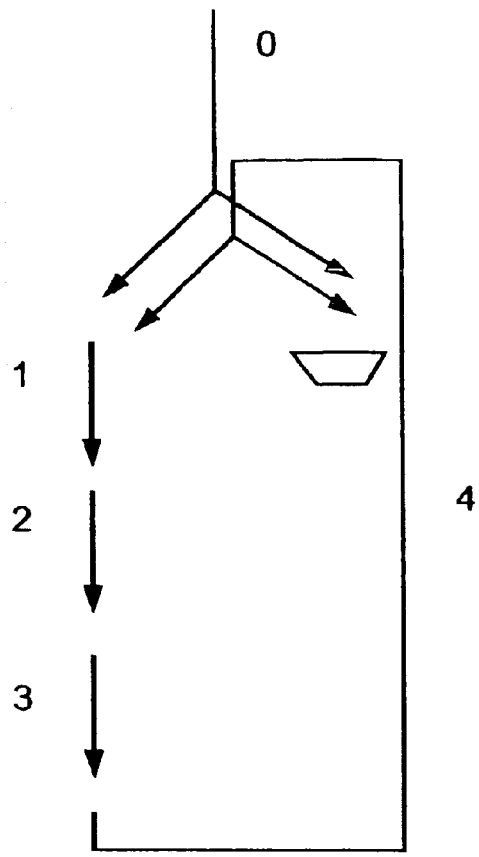
FIG. 9 shows an example of the segmentation of the client process for the sequential control flow graph according to the present invention.
FIG. 10 shows exemplary pseudocode for an exemplary annotation process with regard to tagging according to the present invention.

FIG. 9 shows an example of the segmentation of the client process for the sequential control flow graph. The segments are marked as numbers on the basic blocks. Note that each block may optionally be covered by multiple segments (such as the top node). Also, segments may optionally fork and join, as shown with regard to segment 4, which forks in this example.

According to optional but preferred embodiments of the present invention, the sequential control flow graph itself is more preferably optimized by eliminating exponential expansion of segments which contain nested if-then-else clauses. Such exponential expansion is eliminated by merging sequential control flow graph nodes after the segmentation phase, such that the merged nodes refer to the same source action and therefore represent the same action, and are also part of the same segment. One example of a suitable optimization process is performed by first computing a hash number for each node, based on the source reference and segment for that node; and then traversing each segment, replacing references to nodes with the first node in the node list that matches the hash value of the referenced nodes.

As an example, a simple program may have the following structure:

```
If B then {
    A1
} else {
    A2
};
    A3
```

The un-optimized control flow graph starts with a guard node, whose positive child would be a basic block node containing A1 followed by a basic block node containing A3. The negative child is a basic block containing A2 followed by a second instance of a basic block containing A3.

The optimization process stores the two basic blocks containing A3 with the same hash value. When re-constructing the control flow graph, the same instance of a basic block node will be used to represent A3 under both the positive and the negative branch. This reduces the size of the control flow graph.

As shown with regard to FIG. 1, in the next phase, an interrelationship is created between the elaboration graph and the sequential control flow graph. Such an interrelationship considers the effects of each process instance on the elaborated structure, and thereby uncovers communication through global variables, side effects and race conditions.

In order to create such an interrelationship, preferably the control flow is first projected over the structure, by identifying all instances that have nested processes. These instances serve as the me (or the self reference) context for their processes. Processes which are present in the pre-run time structure are termed "root processes", and are started through the run( ) method. Such processes typically have an infinite loop at their top level. Root processes may in turn call methods or start new processes. The issues related to method calls are discussed in greater detail below.

Since each nested process in a list item breaks the list symmetry, the nested processes are optionally and more preferably classified into several classes, each of which is then handled separately. A first class is the independent process, which only accesses data in the list object, but which does not access other list objects or the global context. This process does not actually break the symmetry, and one instance of such a process is sufficient to demonstrate the effects of all such processes on the elaboration graph. The next class is the neighbor dependent process, which uses its index to access other lists, and peeks into the predecessor and successor objects in the list. Multiple such processes need to be present in order to see the full effect on the elaboration graph.

For example, suppose that a list item can access fields within the object as well as fields within the predecessor object in the list. All list elements are symmetric, except for item 0 that has no predecessor. To fully evaluate the effect of such objects in a program, two cases must be considered: the case of item 0 and the case of an item whose index is greater than 0. In general neighbor dependent processes can be analyzed by considering more than one list item but less than the full list. Such processes break symmetry in some ways but may preserve it in other ways, such that a small set of representative processes may need to be considered in order to identify the full effect on the elaboration graph.

The third class is the arbitrarily dependent process, which is not restricted in access at all and therefore which always breaks symmetry. The effect of these processes cannot be determined by examining the behavior of a small set of such processes thereof, such that the presence of this type of process must be assumed to break symmetry and thus must be examined independently.

Next, the process of annotation optionally and more preferably handles aliasing, which is a problem introduced by dereferencing. If a variable, such as a parameter or field, is assigned the reference to a node in the elaboration graph, any operation performed on such a variable should preferably be applied to the elaboration graph node. Therefore, the variable now functions as an alias to the node. However, if during the processing of the control structure such dereferencing is passed through a plurality of different assignments, some of which are conditional, the end result could be an indeterminate, non-defined aliasing relationship which cannot be determined during static analysis. In order to solve this problem, preferably a list of possible aliases is maintained for each variable. If a decision to select a particular alias must be made during run-time, instantiated selector logic then preferably addresses the correct node.

As an example, consider the following simple program:

```
Struct f_type {
    Left:int;
    Right:int;
};
Struct A {
    F : f_type;
    B :bool;
```

-continued

```
Prog( ):int is {
    If B then {
        Result=f.left;
    } else {
        result=f.right;
    }
}
```

The program prog( ) may return either f.left or f.right, depending on the value of B. The result variable is an alias for both. Some logic must be created in the target language, such that result will reflect the value of the correct field at runtime.

Such a solution is preferred, since it prevents unclear aliasing, but may have the disadvantage of requiring a large number of potential aliases to be stored.

As previously described, method calls may occur when the root process calls another method, for example. Preferably, each method call results in the actions of the called method being added to the sequential control flow graph, with formal parameters being replaced by actual parameters. Difficulties with this solution may arise from aliasing, as previously described, and polymorphism.

Polymorphic methods require the type to be resolved in order to determine which implementation to call, since in effect, the exact method is not determined until the particular implementation is selected. Such a selection of a particular implementation, and hence resolution of the polymorphism, may not be possible during static analysis for a number of reasons. For example, the static type may not be a leaf of the type tree, such that the actual type may be a subtype. Alternatively, the static type may be an unresolved when sub-type, such that the determinant may change its value at run-time. In order to solve this problem, more preferably all possible cases are supported, with sufficient logic added to be able to select an appropriate implementation during run-time. The complexity limitations are similar to that for the aliasing case, but these two effects may amplify each other, potentially inflating the size of the structure created in the target language.

Once these different types of ambiguities have been resolved, or at least sufficiently supported to enable resolution at run-time, the annotation process preferably then continues with the tagging of all instances in the elaboration graph with labels that identify data access. A tag more preferably features the accessing instance, the accessing segment within the process instance and the access mode (read or write). The tagging process is optionally and more preferably performed as follows. First, the elaboration graph is traversed and every process instance which is found preferably serves as a starting point. At each starting point, for every segment, all actions are preferably stepped through. Every data access expression of each action is mapped onto the elaboration graph, more preferably also according to the action context. Each target instance may then be identified, and tagged according to the semantics of the data access expression. As the process of tagging is performed, a global data flow pattern emerges, as the information is used to compute a static schedule for the output model when possible, and optionally also in order to produce diagnostic messages for display to the user.

FIG. 10 shows exemplary pseudocode for an exemplary annotation process with regard to tagging. This pseudocode emphasizes that the annotation starts with each node, and then penetrates more deeply into the structure of each node in a recursive manner, until each expression within each action is found and tagged.

Turning again to FIG. 1, the next stage is optionally and more preferably scheduling of execution for the output translated code in the target language. Such scheduling is highly preferred in order to maintain the scheduling rules of the original language, such as the e language, during execution in the target language, which may either use different scheduling rules or which may actually execute in a truly concurrent environment. In such a concurrent environment, events do not occur according to a potentially artificial order or schedule, but instead occur as defined by the program. By contrast, if a target language executes according to different scheduling rules, events may occur according to an arbitrary order.

According to an optional but preferred embodiment of the present invention, in order to prevent such arbitrary ordering, preferably scheduling considerations are compiled into the structure of the translated code in the form of guards. Thus, such considerations are more preferably required to be static in nature, in order to enable these considerations to be immediately realized as guards.

The scheduling phase of the method of the present invention, as described with regard to FIG. 1, therefore preferably attempts to find a static order of priority for all segments, which is herein termed the schedule. Given an execution state, which is the list of values associated with all control variables, the schedule determines the order in which all exposed actions are performed. Exposed actions are herein defined as those actions with guards that are true.

A particularly preferred aspect of the scheduling phase is the elimination of races. A race condition is a very common and serious issue in circuit design. An example of a race condition is shown in Table 1 below by a Verilog program.

TABLE 1

Race Condition

```
module t(clk, a, b, c);
    input clk;
    output a;
    input b;
    input c;
    reg a;
    always @(posedge clk) a=b
    always @(posedge clk) a=c;
endmodule
```

In this example, when the clock "clk" changes from "0" to "1", that is at the positive edge of clk, either a=b may happen first or a=c may happen first. That is, they may race each other. As a result, signal "a" may get the value of "b" or "c." In circuit design, this is an undesired effect because the final value of "a" is nondeterministic.

A race condition is defined as a situation where reading a variable may result in one of several values nondeterministically. To avoid races, circuits are usually designed in some specific ways to prevent a race condition. Another approach is to detect during the design stage if the circuits may have races. Some circuit simulation tools can detect a race condition when the simulator finds that, during the same simulation cycle, a signal (also referred to as a wire, register, or variable) is being written to two or more times, or being written to as well as being read from (see, for example, U.S. Pat. Nos. 5,383,167; 5,818,263; 5,901,061; and 6,009,256).

If the design is race-free, the only constraint on the schedule is to place expression computation before the result of that computation is used. More preferably, a special case is the evaluation of temporal expressions which are required before any TCMs are evaluated. According to the preferred implementation of the present invention with the e temporal language, events may optionally be emitted by TCMs, and must then be permitted to influence the execution of the code within the same clock cycle. The chain of dependency may be handled for at least certain cases of nested dependencies for events emitted by TCMs, for example when an emit operation within one TCM causes another TCM to execute. In order for such dependencies to be correctly handled, the execution of the emit operation is more preferably moved to the beginning of each cycle, a process which is termed "action retiming" herein. Although action retiming itself may cause a scheduling problem, this problem is resolvable within each individual segment.

Optionally and more preferably, only cycle synchronous models are handled by such retiming processes and other scheduling rationalizations. A cycle synchronous model is a model in which the computational results of one cycle influence the next cycle, and is for example the model for the e language. If cycle asynchronous events occur, the user is more preferably alerted in order to resolve these events manually.

Also optionally and more preferably, potential races are identified as part of the analysis of the code which is being translated. Generally, a race is the result of an ambiguous program. The ambiguity of the program causes the runtime scheduler, which determines the timing and order of events, to take an arbitrary decision concerning the order of execution of these events. This order may not then replicated by the actual device under test (DUT). Thus, the user is preferably notified of all suspected races.

A more detailed description of races is that races are created by processes communicating through shared variables without an adequate access protocol. At the annotation phase, each instance in the elaboration graph is tagged with all accesses. Each instance that has multiple access tags, in which at least one such access is a "write" access, may potentially be a suspected race target. However, preferably access tags which belong to the same segment instance are not considered to be a race, as they belong to a single thread of control and therefore will execute sequentially.

More preferably, each suspected race target is examined with regard to the multiple actions which attempt to access that target. Most preferably, the hierarchy of guards for regulating each action is examined, such that the suspected race target is considered to be a race if there exists at least one condition under which these action are exposed. For example, optionally and most preferably, determining whether two boolean conditions are simultaneously true could be used to filter potential races. Also optionally and most preferably, temporal expressions are resolved in order to determine whether two segments can execute concurrently.

In order to at least reduce problems which may be caused by such races, according to preferred embodiments of the present invention, temporal expressions are given priority over TCMs for execution. Also, if read-write races are present, more preferably the write action is scheduled before the read action, in order for values to be computed before they are used. Other actions may also optionally be schedule in order to enable the result of any given action to be determined before this result is require by the next action.

These constraints on the schedule of execution are optionally and more preferably embodied in a scheduling constraint graph. The nodes of the graph are preferably each a segment instance, as such an instance is an atomic, zero-time, sequence of actions. Each constraint which requires the segment to execute before another segment, because of any action of the former segment, is therefore preferably represented as a direct edge from the dependent segment to the independent segment.

Figure 12:
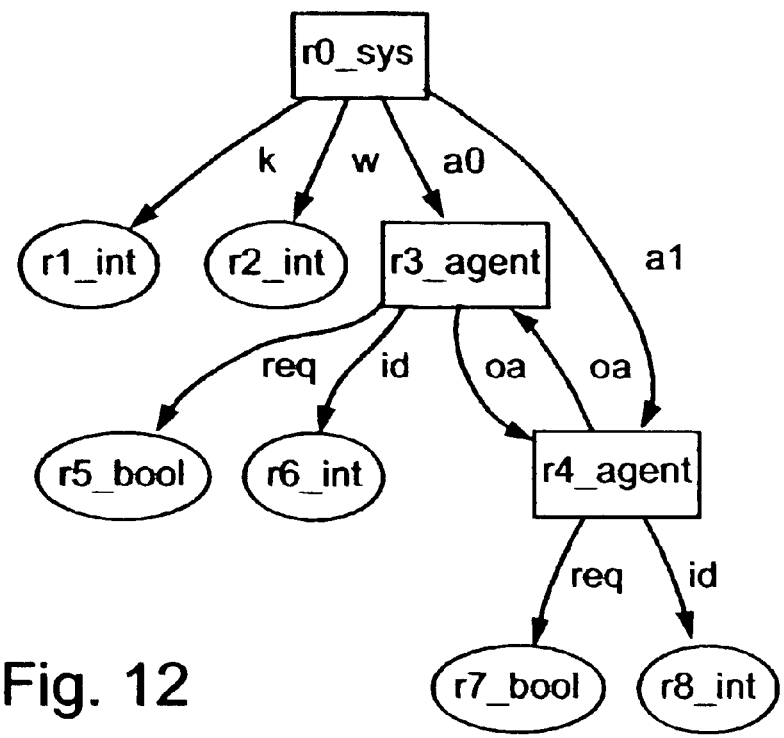
FIG. 12 shows a resultant elaboration graph, created according to the method of the present invention.
Figure 13:
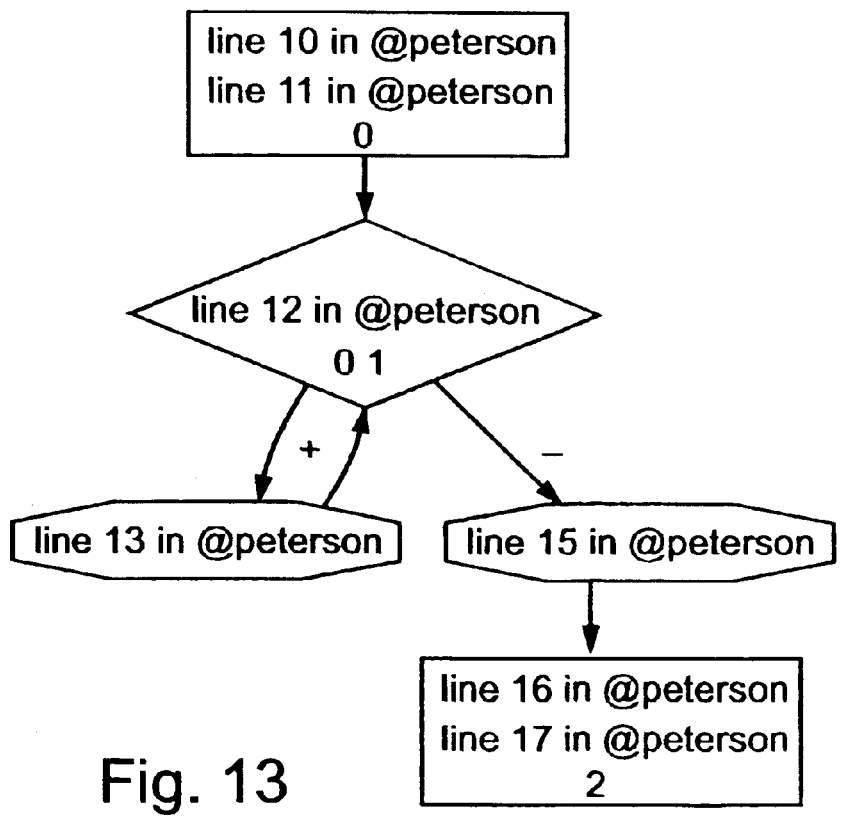
FIG. 13 shows an exemplary segmented scheduling constraint graph.
Figure 14:
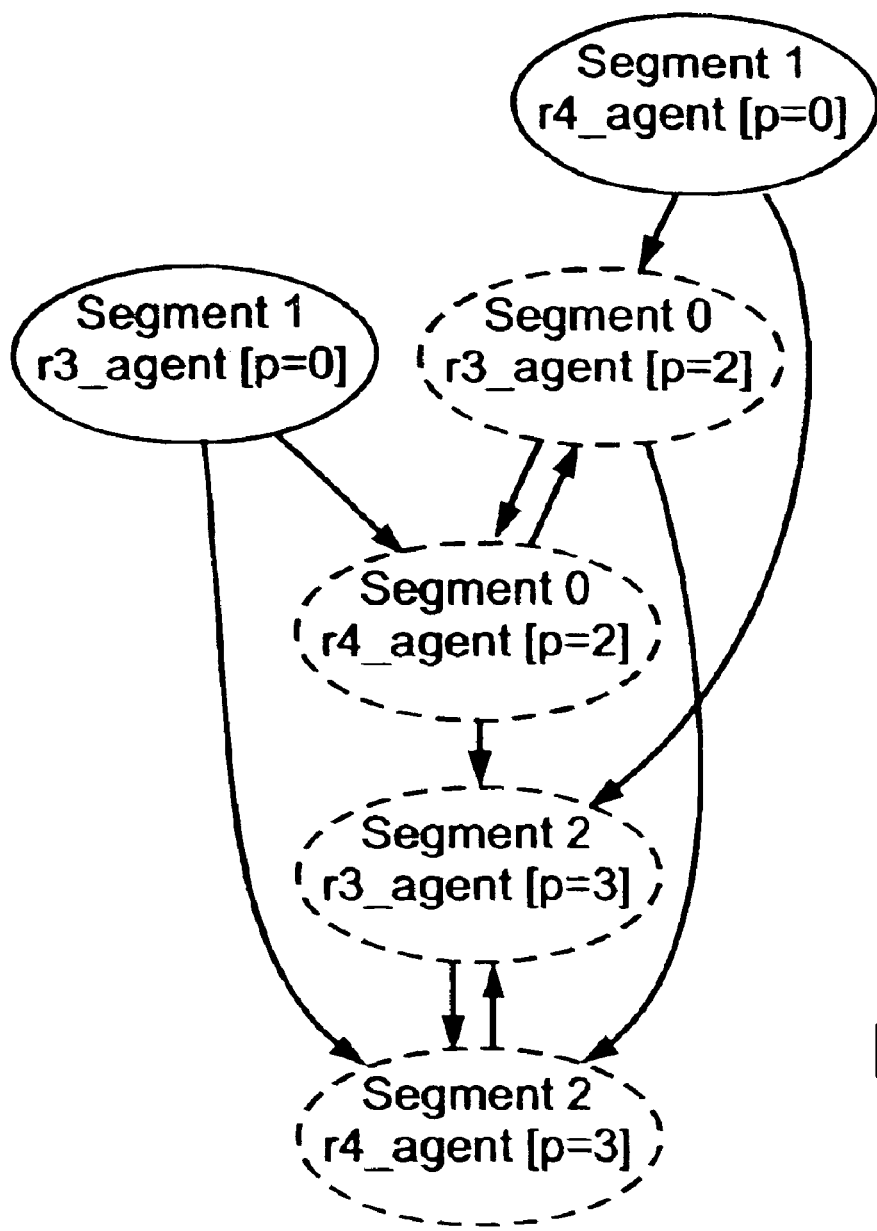
FIG. 14 shows a derived segmented scheduling constraint graph.
Figure 16:
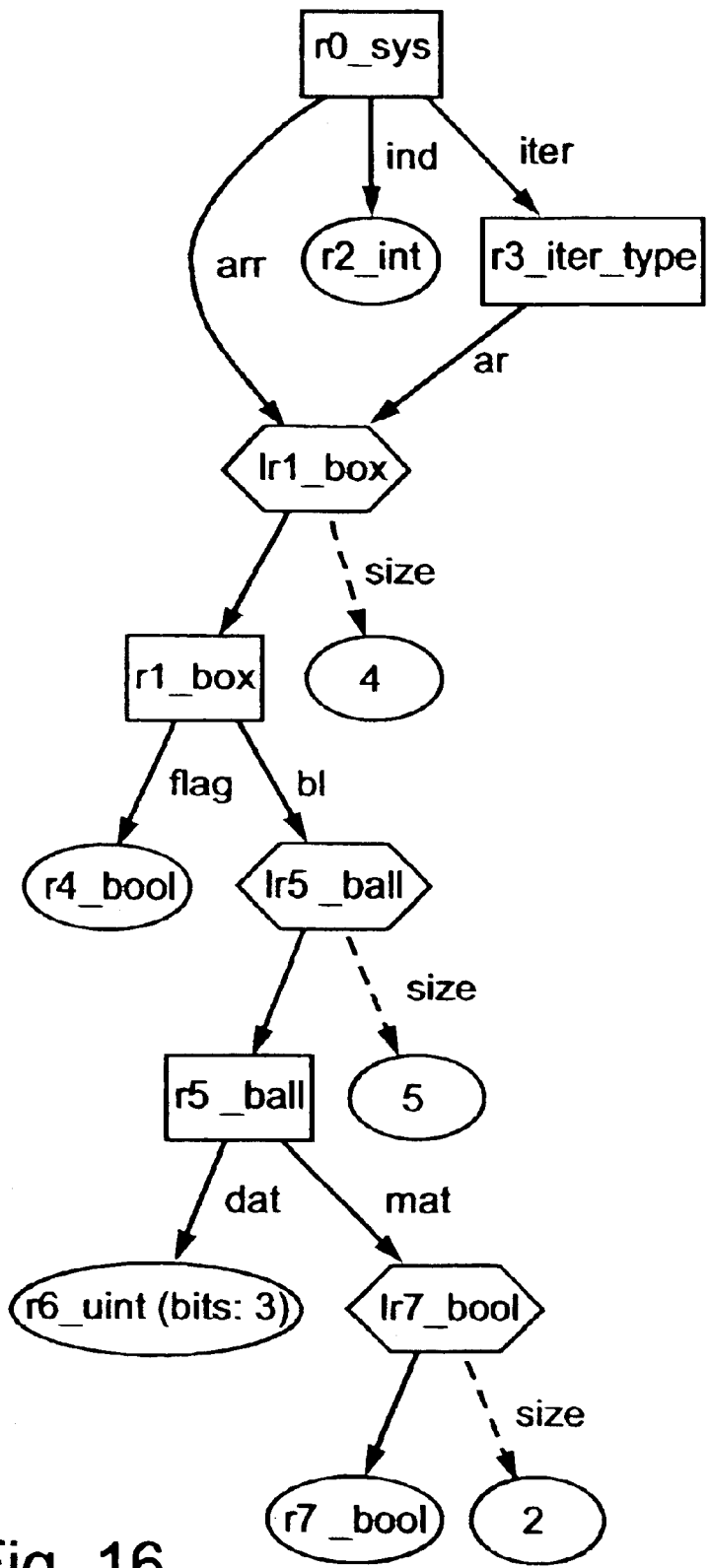
FIG. 16 shows an exemplary graph for operation with the present invention.

FIG. 11 shows a simple two process example as written in the e language. This example contains two objects of type agent nested under sys. These agents execute concurrently, attempting to write a value to a common variable, which is the field w under sys. The agents implement a mutual exclusion algorithm that prevents concurrent access to w, which may cause data corruption. The algorithm requires each agent to assert a request and deposit some type of identifier in a shared, unprotected variable (the field K under sys). If the value remains intact and the other agent deasserts it's request, then the shared variable w may be written to again.

he resultant elaboration graph is shown in FIG. 12. The segmented control flow graph is presented in FIG. 13, while the derived segmented scheduling constraint graph is shown in FIG. 14.

The elaboration graph shows the two shared variables w and K under sys, as well as two instances of the agent object representing the two agents. Each agent has an ID field id, a request field req and a reference to the other agent oa.

The control flow graph shows that each agent can be in one of 3 execution states: segment 0 is the initial request. Segment 1 represents the wait cycle that may be entered if the other agent has access to the shared variable and segment 2 is the state where the agent has access to the shared variable.

The scheduling constraint graph shows the conflicts between the segments of the two agents. Each ellipse represent a segment of one of the agents, and each edge represent a dependency between segments. Co-dependent segments represent conflicts in the schedule. The dashed nodes in the example scheduling constraint graph form two cycles which are the manifestation of suspected write/write races with respect to K and w. The race with respect to K is a true race, while the race with respect to w is not a true race. In order to detect and remove the second cycle, filtering would need to be performed with regard to the temporal properties of the processes which are involved.

Once the scheduling constraint graph has been created, preferably the scheduling process creates a topological order over this graph. The process selects an unconstrained node to schedule, after which all of the constraints leading to that node are removed. This process is more preferably repeated until all of the nodes are scheduled. If the scheduling-constraint graph itself is cycle free, then the process may optionally be repeated without interruption.

However, if this graph has one or more cycles, then the process may halt if no additional independent nodes are available. The process more preferably then performs an arbitrary decision, such that some constraints are ignored. This arbitrary decision may result in poor timing of the output model, such that the user is most preferably notified when such a decision is taken. The presence of such a cycle in the scheduling constraint graph may be considered to imply corresponding timing ambiguity which had not been resolved as previously described. On the other hand, the presence of a cycle alone is not sufficient for causing a race, since the corresponding constraints may have resulted from a false race.

Furthermore, once a node is scheduled, more preferably all the constraints which lead to this node are removed, which may break one or more cycles. The original process may then optionally continue. Most preferably, one or more heuristic rules may be added, in order to minimize such cycle breaking, since cycle breaking may result in the introduction of a timing difference between the original and synthesized models.

As previously described, according to preferred embodiments of the present invention, action retiming is performed in order to support emitted events within TCMs and therefore to rationalize behavior of the executed code. Since an event which is emitted by a TCM is expected to influence the flow of control within the same clock cycle, preferably retimed operations are extracted from the control flow at the annotation stage, more preferably with the guards which govern their execution. The extraction process preferably determines whether the zero time path from the segment entry point to the retimed action contains actions that modify guard conditions, and the user is notified of the existence of any such actions which modify guard conditions.

Retimed actions are then more preferably placed first in the static schedule, such that whenever an action would execute in a particular cycle, depending upon the values of its guards, that particular action is more preferably placed to execute first, before any segment is executed. The results of this execution are then ready to be used by the segments as necessary.

The previous description centered around an example of the method of the present invention with regard to any pair of an original language code and a target language, in which the code in the original language is translated to the target language. A particularly preferred example of an original language/target language pair is code written in the e language for the original language, and Verilog HDL as the target language.

While the invention has been described with respect to a limited number of embodiments, it will be appreciated that many variations, modifications and other applications of the invention may be made.

What is claimed is:

1. A method for at least semi-automatically translating code written in a first language to a second target language, the method comprising:

detecting an underlying control structure for the code in the first language, wherein the first language features structural constraints, dynamic behavior, and at least one hierarchy of objects, respective ones of said objects in said hierarchy having relationships, said relationships between the objects being determined for said code by said structural constraints, and said language imparting said dynamic behavior to said code, said underlying control structure incorporating said relationships and said dynamic behavior;

creating a static framework of resources for supporting the dynamic behavior imparted to said code written in the first language; and mapping the dynamic behavior to the second target language according to said static framework of resources and said underlying control structure.

2. The method of claim 1, wherein said underlying control structure is detected by control flow analysis for an action, to determine at least one of a condition and a trigger for causing said action to execute.

3. The method of claim 2, wherein said at least one of a condition and a trigger is a guard for governing execution of said action, such that control flow analysis comprises at least determining at least one guard for each action.

4. The method of claim 3, wherein said control flow analysis further comprises determining a plurality of guards for creating a sequential control flow graph.

5. The method of claim 4, wherein said underlying control structure for the code in the first language is detected by:

parsing the code; and creating an abstract syntax tree;

wherein said at least one node of said sequential control graph retains a reference to a node of said abstract syntax tree.

6. The method of claim 4, wherein said control flow analysis comprises:

computing a triggering structure for each process of the code in the first language;

determining said at least one guard for each action of said process; and determining a segmentation of said process into a plurality of segments.

7. The method of claim 6, wherein said control flow analysis further comprises:

unrolling at least one loop.

8. The method of claim 6, further comprising retiming at least one action.

9. The method of claim 6, wherein each node is selected from the group consisting of a basic node for representing a list of non-time consuming actions, a guard node for representing a branch point, and a wait node for containing a temporal expression.

10. The method of claim 2, wherein said control flow analysis detects at least one malformed control structure for manual alteration by a user.

11. The method of claim 1, wherein said static framework of resources is created by elaboration, wherein elaboration is performed by allocating a sufficient number of state holding elements for representing dynamic behavior of the code written in the first language.

12. The method of claim 11, wherein said state holding elements are allocated by:

recursively analyzing a structure of the code written in the first language;

determining structural constraints; and creating an elaboration graph from said structure of the code and said structural constraints.

13. The method of claim 12, wherein said elaboration graph features a plurality of nodes selected from the group consisting of scalar nodes, struct nodes and list nodes.

14. The method of claim 12, wherein said elaboration graph is unfolded to completely represent a plurality of structures of the first language.

15. The method of claim 14, wherein the first language features symmetry, and wherein said elaboration graph is unfolded to overcome an asymmetrical feature of the code.

16. The method of claim 15, wherein said asymmetrical feature is selected from the group consisting of a temporal expression and a time consuming method.

17. The method of claim 12, wherein said underlying control structure is detected by control flow analysis for an action, to determine at least one of a condition and a trigger for causing said action to execute, wherein said at least one of a condition and a trigger is a guard for governing execution of said action, and wherein a plurality of guards is determined for creating a sequential control graph, the method further comprising:

determining an interrelationship between said elaboration graph and said sequential control graph.

18. The method of claim 17, wherein said interrelationship is used to detect a race.

19. The method of claim 17, wherein said interrelationship is used to compute an execution schedule.

20. The method of claim 1, wherein the first language features at least one type of symmetry, and wherein said at least one type of symmetry is maintained when creating said static framework of resources.

21. The method of claim 1, wherein the first language is a verification language.

22. The method of claim 1, wherein the code, after translation to the second language, performs verification of a design.

* * * * *